United States Patent
Huang

(10) Patent No.: US 10,691,965 B2
(45) Date of Patent: Jun. 23, 2020

(54) FINGERPRINT RECOGNITION METHOD AND APPARATUS AND COMPUTER READABLE STORAGE MEDIUM

(71) Applicant: BEIJING XIAOMI MOBILE SOFTWARE CO., LTD., Beijing (CN)

(72) Inventor: Xuebin Huang, Beijing (CN)

(73) Assignee: BEIJING XIAOMI MOBILE SOFTWARE CO., LTD., Beijing (CN)

( * ) Notice: Subject to any disclaimer, the term of this patent is extended or adjusted under 35 U.S.C. 154(b) by 5 days.

(21) Appl. No.: 16/232,825

(22) Filed: Dec. 26, 2018

(65) Prior Publication Data

US 2019/0205683 A1  Jul. 4, 2019

(30) Foreign Application Priority Data

Dec. 28, 2017 (CN) .......................... 2017 1 1454251

(51) Int. Cl.
| | | |
|---|---|---|
| *G06K 9/03* | (2006.01) | |
| *G01R 31/3163* | (2006.01) | |
| *G06K 9/00* | (2006.01) | |
| *G06K 9/20* | (2006.01) | |

(52) U.S. Cl.
CPC .......... *G06K 9/03* (2013.01); *G01R 31/3163* (2013.01); *G06K 9/0002* (2013.01); *G06K 9/00087* (2013.01); *G06K 9/209* (2013.01); *G06K 9/00026* (2013.01)

(58) Field of Classification Search
CPC ........ G06K 9/00006–0012; G06K 9/00–0012; G06K 9/03–036
See application file for complete search history.

(56) References Cited

U.S. PATENT DOCUMENTS

| | | | | |
|---|---|---|---|---|
| 7,584,068 B2 * | 9/2009 | Xu | ...................... | G01R 31/2829 702/104 |
| 10,089,546 B2 * | 10/2018 | Bellier | .................... | G06K 9/036 |
| 10,216,976 B2 * | 2/2019 | Sun | ......................... | G01R 31/44 |
| 10,482,308 B2 * | 11/2019 | Kim | ..................... | G06K 9/00026 |
| 2005/0131578 A1 * | 6/2005 | Weaver | .............. | G01G 19/4144 700/244 |
| 2007/0206113 A1 * | 9/2007 | Nakamura | ......... | G06K 9/00013 348/362 |
| 2008/0208495 A1 * | 8/2008 | Xu | ..................... | G01R 31/2829 702/65 |

(Continued)

OTHER PUBLICATIONS

Extended European Search Report in EP18248216.6—1207 dated May 27, 2019.

*Primary Examiner* — Patrick F Marinelli
(74) *Attorney, Agent, or Firm* — Syncoda LLP; Feng Ma

(57) ABSTRACT

A fingerprint recognition method includes: acquiring a prestored number of historical defect pixels after a fingerprint recognition sensor captures a first fingerprint image; prohibiting performing matching recognition on the first fingerprint image upon the number of the historical defect pixels being greater than or equal to a first preset number threshold; detecting a number of damaged capturing modules of the fingerprint recognition sensor to obtain a number of current defect pixels; and updating the number of the historical defect pixels by using the number of the current defect pixels, the updated number of the historical defect pixels being used for determining whether to perform matching recognition on a fingerprint image captured next time.

18 Claims, 4 Drawing Sheets

(56) References Cited

U.S. PATENT DOCUMENTS

| | | | |
|---|---|---|---|
| 2008/0224721 A1* | 9/2008 | Kim | H01L 27/14618 324/756.02 |
| 2013/0329031 A1* | 12/2013 | Miura | G06K 9/00114 348/77 |
| 2014/0241598 A1* | 8/2014 | Fedele | G06K 9/00046 382/125 |
| 2015/0071510 A1* | 3/2015 | Kim | G06K 9/00013 382/124 |
| 2015/0106048 A1* | 4/2015 | Xie | G04F 10/105 702/136 |
| 2017/0185820 A1* | 6/2017 | Sun | G01R 31/44 |
| 2017/0255328 A1* | 9/2017 | Zyskind | G06F 3/03545 |
| 2017/0344799 A1* | 11/2017 | Zhou | G06K 9/00013 |
| 2017/0344800 A1* | 11/2017 | Zhou | G06F 21/32 |
| 2017/0344803 A1* | 11/2017 | Zhou | G06K 9/00013 |
| 2017/0344841 A1* | 11/2017 | Bellier | G06K 9/0002 |
| 2018/0046848 A1* | 2/2018 | Zhou | G06K 9/62 |
| 2018/0068167 A1* | 3/2018 | Zhang | G06K 9/00026 |
| 2018/0107853 A1* | 4/2018 | Zhou | G06K 9/00013 |
| 2018/0107860 A1* | 4/2018 | Zhou | G06K 9/00026 |
| 2018/0107861 A1* | 4/2018 | Zhou | G06K 9/00013 |
| 2018/0121702 A1* | 5/2018 | Kim | G06K 9/036 |
| 2018/0211084 A1* | 7/2018 | Zhang | G06K 9/00 |
| 2018/0268186 A1* | 9/2018 | Zhou | G06K 9/00013 |
| 2018/0330145 A1* | 11/2018 | Dai | G06K 9/036 |
| 2019/0018123 A1* | 1/2019 | Narasimha-Iyer | G01S 15/8925 |
| 2019/0087623 A1* | 3/2019 | Zhang | G06K 9/00 |
| 2019/0205682 A1* | 7/2019 | Huang | G01R 27/2605 |
| 2019/0205683 A1* | 7/2019 | Huang | G01R 31/3163 |

\* cited by examiner

FINGERPRINT RECOGNITION METHOD AND APPARATUS AND COMPUTER READABLE STORAGE MEDIUM

CROSS-REFERENCE TO RELATED APPLICATIONS

This application claims priority to Chinese Patent Application No. 201711454251.7, filed on Dec. 28, 2017, the entire content of which is incorporated herein by reference.

BACKGROUND

Fingerprint recognition technologies have been widely used in terminals such as smart mobile phones or tablet computers. Generally, a terminal may be provided with a fingerprint recognition sensor, which may include a plurality of capturing modules arranged in an array. Each of the capturing modules may capture an image of its corresponding fingerprint region. A fingerprint image of a user may be obtained by combining the images captured by the plurality of capturing modules. By matching the fingerprint image with a prestored fingerprint template, fingerprint recognition can be implemented based on the matching result. During repeated usage, some of the capturing modules of the fingerprint recognition sensor may be damaged. When the number of the damaged capturing modules is larger, the fingerprint recognition sensor cannot capture fingerprint images correctly.

SUMMARY

The present disclosure generally relates to the field of fingerprint recognition, and more specifically to a fingerprint recognition method and apparatus, and a computer readable storage medium.

Embodiments of the present disclosure provide a fingerprint recognition method and apparatus and a computer readable storage medium, and technical solutions provided by the embodiments of the present disclosure can enhance fingerprint recognition efficiency.

According to a first aspect of the embodiments of the present disclosure, there is provided fingerprint recognition method, which includes:

acquiring a prestored number of historical defect pixels after a fingerprint recognition sensor captures a first fingerprint image, the number of the historical defect pixels referring to a number of damaged capturing modules of the fingerprint recognition sensor detected before the fingerprint recognition sensor captures the first fingerprint image;

prohibiting performing matching recognition on the first fingerprint image when the number of the historical defect pixels is greater than or equal to a first preset number threshold;

detecting the number of the damaged capturing modules of the fingerprint recognition sensor to obtain a number of current defect pixels; and updating the number of the historical defect pixels by using the number of the current defect pixels, the updated number of the historical defect pixels being used for deciding whether to perform matching recognition on a fingerprint image captured next time.

In some embodiments, the method further includes:
prompting a user to reperform fingerprint recognition when the number of the current defect pixels is less than the first preset number threshold.

In some embodiments, the method further includes:
prompting a user to replace the fingerprint recognition sensor when the number of the current defect pixels is greater than or equal to the first preset number threshold.

In some embodiments, the detecting the number of the damaged capturing modules of the fingerprint recognition sensor to obtain a number of current defect pixels includes:

acquiring a number of historical effective detections, the number of the historical effective detections referring to a number of times of the detected number of the damaged capturing modules of the fingerprint recognition sensor being greater than or equal to the first preset number threshold before the fingerprint recognition sensor captures the first fingerprint image; and detecting the number of the damaged capturing modules of the fingerprint recognition sensor when the number of the historical effective detections is less than a preset frequency threshold to obtain the number of the current defect pixels.

In some embodiments, the number of the current defect pixels includes a number of current first defect pixels or a number of current second defect pixels, and the detecting the number of the damaged capturing modules of the fingerprint recognition sensor to obtain the number of current defect pixels includes:

detecting the number of the damaged capturing modules of the fingerprint recognition sensor;

obtaining the number of the damaged capturing modules of the fingerprint recognition sensor as the number of the current first defect pixels when the number of the damaged capturing modules of the fingerprint recognition sensor is less than the first preset number threshold; and detecting a number of damaged capturing modules within a preset region of the fingerprint recognition sensor and obtaining the number of the damaged capturing modules within the preset region as the number of the current second defect pixels when the number of the damaged capturing modules of the fingerprint recognition sensor is greater than or equal to the first preset number threshold.

In some embodiments, the updating the number of the historical defect pixels by using the number of the current defect pixels includes:

updating the number of the historical defect pixels by using the number of the current first defect pixels or the number of the current second defect pixels.

In some embodiments, the preset region is a region where the capturing module having a probability of successfully capturing the fingerprint image greater than a preset probability threshold is.

In some embodiments, the method further includes:
acquiring, from a second fingerprint image, a fingerprint image region captured by the capturing module within the preset region when the fingerprint recognition sensor successfully captures the second fingerprint image and the updated number of the historical defect pixels is less than a second preset number threshold after updating the number of the historical defect pixels by using the number of the current second defect pixels; and performing matching recognition on the fingerprint image region.

In some embodiments, the method further includes:
detecting and storing locations of the damaged capturing modules of the fingerprint recognition sensor after prohibiting performing matching recognition on the first fingerprint image.

In some embodiments, the detecting the number of the damaged capturing modules of the fingerprint recognition sensor to obtain a number of current defect pixels includes:

applying a preset voltage to each of the capturing modules of the fingerprint recognition sensor after detecting a finger leaves;

acquiring an electric current value for each of the capturing modules after the preset voltage is applied;

determining one of the capturing modules of the fingerprint recognition sensor as a damaged capturing module when the electric current value of the capturing module satisfies a preset condition after the preset voltage is applied; and acquiring the number of the damaged capturing modules of the fingerprint recognition sensor to obtain the number of the current defect pixels.

According to a second aspect of the embodiments of the present disclosure, there is provided a fingerprint recognition apparatus, which includes:

an acquiring module, configured to acquire a prestored number of historical defect pixels after a fingerprint recognition sensor captures a first fingerprint image, the number of the historical defect pixels referring to a number of damaged capturing modules of the fingerprint recognition sensor detected before the fingerprint recognition sensor captures the first fingerprint image;

a prohibiting module, configured to prohibit performing matching recognition on the first fingerprint image when the number of the historical defect pixels is greater than or equal to a first preset number threshold;

a detecting module, configured to detect the number of the damaged capturing modules of the fingerprint recognition sensor to obtain a number of current defect pixels; and an updating module, configured to update the number of the historical defect pixels by using the number of the current defect pixels, the updated number of the historical defect pixels being used for deciding whether to perform matching recognition on a fingerprint image captured next time.

In some embodiments, the apparatus further includes a first prompting module.

The first prompting module is configured to prompt a user to reperform fingerprint recognition when the number of the current defect pixels is less than the first preset number threshold.

In some embodiments, the apparatus further includes a second prompting module.

The second prompting module is configured to prompt a user to replace the fingerprint recognition sensor when the number of the current defect pixels is greater than or equal to the first preset number threshold.

In some embodiments, the detecting module is configured to:

acquire a number of historical effective detections, the number of the historical effective detections referring to a number of times of the detected number of the damaged capturing modules of the fingerprint recognition sensor being greater than or equal to the first preset number threshold before the fingerprint recognition sensor captures the first fingerprint image; and detect the number of the damaged capturing modules of the fingerprint recognition sensor when the number of the historical effective detections is less than a preset frequency threshold to obtain the number of the current defect pixels.

In some embodiments, the number of the current defect pixels includes a number of current first defect pixels or a number of current second defect pixels, and the detecting module is configured to:

detect the number of the damaged capturing modules of the fingerprint recognition sensor;

obtain the number of the damaged capturing modules of the fingerprint recognition sensor as the number of the current first defect pixels when the number of the damaged capturing modules of the fingerprint recognition sensor is less than the first preset number threshold; and detect a number of damaged capturing modules within a preset region of the fingerprint recognition sensor and obtain the number of the damaged capturing modules within the preset region as the number of the current second defect pixels when the number of the damaged capturing modules of the fingerprint recognition sensor is greater than or equal to the first preset number threshold.

In some embodiments, the updating module is configured to:

update the number of the historical defect pixels by using the number of the current first defect pixels or the number of the current second defect pixels.

In some embodiments, the preset region is a region where the capturing module having a probability of successfully capturing the fingerprint image greater than a preset probability threshold is.

In some embodiments, the apparatus further includes:

a capturing module, configured to acquire, from a second fingerprint image, a fingerprint image region captured by the capturing module within the preset region when the fingerprint recognition sensor successfully captures the second fingerprint image and the updated number of the historical defect pixels is less than a second preset number threshold after updating the number of the historical defect pixels by using the number of the current second defect pixels; and a recognizing module, configured to perform matching recognition on the fingerprint image region.

In some embodiments, the detecting module is further configured to:

detect and store locations of the damaged capturing modules of the fingerprint recognition sensor after prohibiting performing matching recognition on the first fingerprint image.

In some embodiments, the detecting module is configured to:

apply a preset voltage to each of the capturing modules of the fingerprint recognition sensor after detecting a finger leaves;

acquire an electric current value for each of the capturing modules after the preset voltage is applied;

determine one of the capturing modules of the fingerprint recognition sensor as a damaged capturing module when the electric current value of the capturing module satisfies a preset condition after the preset voltage is applied; and acquire the number of the damaged capturing modules of the fingerprint recognition sensor to obtain the number of the current defect pixels.

According to a third aspect of the embodiments of the present disclosure, there is provided a fingerprint recognition apparatus, which includes:

a processor, and a memory configured to store instructions executable by the processor.

The processor is configured to:

acquire a prestored number of historical defect pixels after a fingerprint recognition sensor captures a first fingerprint image, the number of the historical defect pixels referring to a number of damaged capturing modules of the fingerprint recognition sensor detected before the fingerprint recognition sensor captures the first fingerprint image;

prohibit performing matching recognition on the first fingerprint image when the number of the historical defect pixels is greater than or equal to a first preset number threshold;

detect the number of the damaged capturing modules of the fingerprint recognition sensor to obtain a number of current defect pixels; and update the number of the historical defect pixels by using the number of the current defect pixels, the updated number of the historical defect pixels being used for deciding whether to perform matching recognition on a fingerprint image captured next time.

According to a fourth aspect of the embodiments of the present disclosure, there is provided a computer readable storage medium, which stores a computer program. When the computer program is executed by a processor, any one of the fingerprint recognition methods according to the first aspect can be implemented.

The technical solutions provided by the embodiments of the present disclosure may include the following beneficial effects.

Performing matching recognition on the first fingerprint image is prohibited when the number of the historical defect pixels is greater than or equal to a first preset number threshold. After performing matching recognition on the first fingerprint image is prohibited, the number of the damaged capturing modules of the fingerprint recognition sensor is detected again to obtain a number of current defect pixels. Next, the number of the historical defect pixels is updated by using the number of the current defect pixels, wherein the updated number of the historical defect pixels is used for deciding whether to perform matching recognition on a fingerprint image captured next time. When a terminal misrecognizes a normal capturing module as a damaged capturing module, this may cause the number of the historical defect pixels to be greater than or equal to the first preset number threshold even though the fingerprint recognition sensor functions properly. In such a case, the terminal may revise the number of the historical defect pixels based on the number of the current defect pixels. In this way, it is ensured that in subsequent procedures, the terminal can normally recognize a fingerprint image, which avoids the occurrence of the circumstance where the fingerprint recognition sensor functions properly but the terminal cannot continuously recognize fingerprints, and thus the fingerprint recognition efficiency is enhanced.

It should be understood that the above general description and the detailed description below are merely exemplary and explanatory, and do not limit the present disclosure.

BRIEF DESCRIPTION OF THE DRAWINGS

To clearly illustrate the various embodiments provided in the present disclosure, the following drawings are provided accompanying the description of the embodiments.

It is noted that these drawings should be interpreted to serve illustrating purposes only, and that these drawings may represent just some, but not all, of embodiments of the present disclosure. For those or ordinary skill in the art, other embodiments that are based on the structures as described below and illustrated in these drawings may become apparent. As such, these other embodiments should be interpreted to be contained within the scope of the disclosure.

DETAILED DESCRIPTION

Descriptions will now be made in detail with respect to some embodiments, examples of which are illustrated in the accompanying drawings. The following description refers to the accompanying drawings in which the same numbers in different drawings may represent the same or similar elements unless otherwise represented. The implementations set forth in the following description of example embodiments do not represent all implementations consistent with the disclosure. Instead, they are merely examples of devices and methods consistent with aspects related to the disclosure as recited in the appended claims.

To enhance fingerprint recognition security, after a fingerprint recognition sensor captures a fingerprint image, a terminal may acquire the number of the damaged capturing modules of the fingerprint recognition sensor detected in advance. When the number of the damaged capturing modules becomes too large, the terminal may prohibit recognizing the captured fingerprint image to avoid misrecognition that can potentially cause an unauthorized user to succeed in fingerprint verification.

In practical applications, a terminal can be provided with a fingerprint recognition sensor, and can implement a fingerprint recognition function via the fingerprint recognition sensor.

However, in some cases, the terminal can possibly misrecognize a normal capturing module as a damaged capturing module. When the terminal determines that the number of the damaged capturing modules of the fingerprint recognition sensor is too large, the terminal may keep on prohibiting performing the procedure of recognizing fingerprint images, which may cause the occurrence of situations where the fingerprint recognition sensor functions properly but the terminal cannot properly recognize fingerprints, thereby having a detrimental effect on the fingerprint recognition efficiency.

Figure 1:
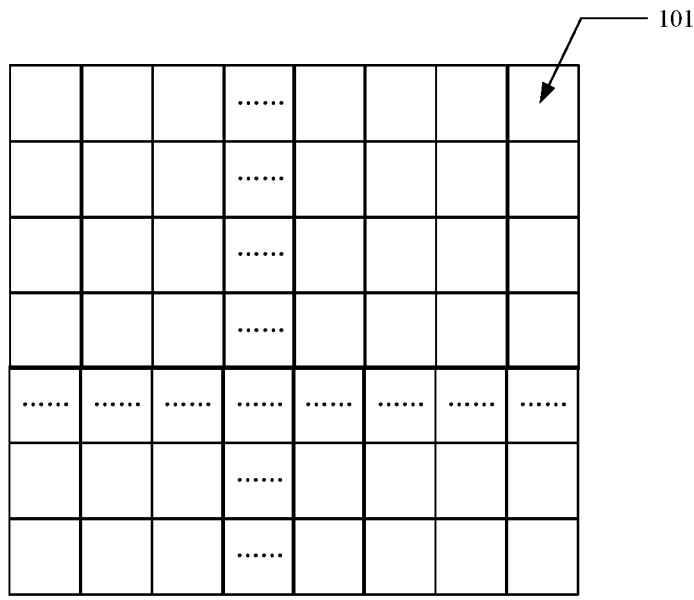
FIG. 1 is a schematic diagram of a fingerprint recognition sensor according to some embodiments.

As shown in FIG. 1, a fingerprint recognition sensor can include a plurality of capturing modules 101. The "modules" may also be referred to as pixels or dots of the fingerprint recognition sensor arranged in an array.

It is noted that the various device components, units, blocks, or portions may have modular configurations, or are composed of discrete components, but nonetheless may be referred to as "modules" in general. In other words, the "modules" or "units" referred to herein may or may not be in modular forms.

When performing fingerprint recognition, a user may place a finger on the fingerprint recognition sensor, and a capturing module 101 of the fingerprint recognition sensor may capture an image within a fingerprint region corresponding to the capturing module 101. A fingerprint image of the user may be obtained by combining the images captured by the plurality of capturing modules 101 of the fingerprint recognition sensor.

In an example, a capacitive fingerprint recognition sensor can be employed, and can include a plurality of equal-area capacitor plates arranged in an array, wherein each of the capacitor plates may be regarded as a capturing module.

When the user places a finger on the capacitive fingerprint recognition sensor, a capacitor plate of the capacitive fingerprint recognition sensor may form a capacitor together with a user fingerprint region over the capacitor plate. A capacitance value of the capacitor depends on a distance between the user fingerprint region and the capacitor plate. The capacitive fingerprint recognition sensor can charge each capacitor plate, and then discharge each capacitor plate by using a standard current. The capacitor plate with a larger capacitance value (e.g., the user fingerprint region located in a fingerprint ridge) is slower to discharge, and the capacitor plate with a smaller capacitance value (e.g., the user fingerprint region located in a fingerprint valley) is faster to discharge.

As such, the capacitive fingerprint recognition sensor can determine the user fingerprint region over the capacitor plate as the fingerprint ridge or the fingerprint valley, for example based on how fast the capacitor plate discharges. In this way, the fingerprint image of the user can be obtained.

After the fingerprint image of the user is obtained, the terminal may compare the fingerprint image of the user with a prestored fingerprint template of an authorized user. When the fingerprint image of the user is consistent with the fingerprint template of the authorized user, the terminal may determine that the user succeeds in fingerprint verification, otherwise, the terminal may determine that the user fails in fingerprint verification.

In some cases, the capturing modules of the fingerprint recognition sensor can possible be damaged due to physical or chemical interactions. When the number of the damaged capturing modules is too large, the fingerprint recognition sensor cannot capture fingerprint images normally. In such a case, to enhance the fingerprint recognition security and to prevent misrecognition from causing an unauthorized user to succeed in fingerprint verification, the terminal may prohibit recognizing a fingerprint image captured by the fingerprint recognition sensor.

The mobile terminal can determine when to prohibit recognizing a fingerprint image captured by the fingerprint recognition sensor. In implementations, the terminal may periodically detect the number of the damaged capturing modules of the fingerprint recognition sensor. For example, the terminal may detect the number of the damaged capturing modules of the fingerprint recognition sensor after each fingerprint recognition.

Before recognizing a fingerprint image captured by the fingerprint recognition sensor, the terminal may acquire the number of the damaged capturing modules of the fingerprint recognition sensor detected most recently by the terminal. When this number is smaller than a preset value, the terminal may recognize a fingerprint image captured by the fingerprint recognition sensor; whereas when this number is greater than or equal to the preset value, the terminal may prohibit recognizing the fingerprint image captured by the fingerprint recognition sensor.

In some situations, the terminal can possibly misrecognize a normal capturing module as a damaged capturing module. For example, when the terminal detects the number of the damaged capturing modules of the fingerprint recognition sensor, the user's finger or skin may casually touch the fingerprint recognition sensor, which may cause the terminal to misrecognize a normal capturing module as a damaged capturing module, thereby leading to the conclusion that the number of the damaged capturing modules of the fingerprint recognition sensor detected by the terminal is greater than the preset value, while actually it is not.

As such, when performing fingerprint recognition subsequently, the terminal may keep on prohibiting performing the procedure of recognizing fingerprint images based on the number of the damaged capturing modules of the fingerprint recognition sensor incorrectly detected by the terminal, which may cause the occurrence of the situations where the fingerprint recognition sensor functions properly but the terminal cannot continuously recognize fingerprints, thereby having a detrimental effect on the fingerprint recognition efficiency.

Figure 2:
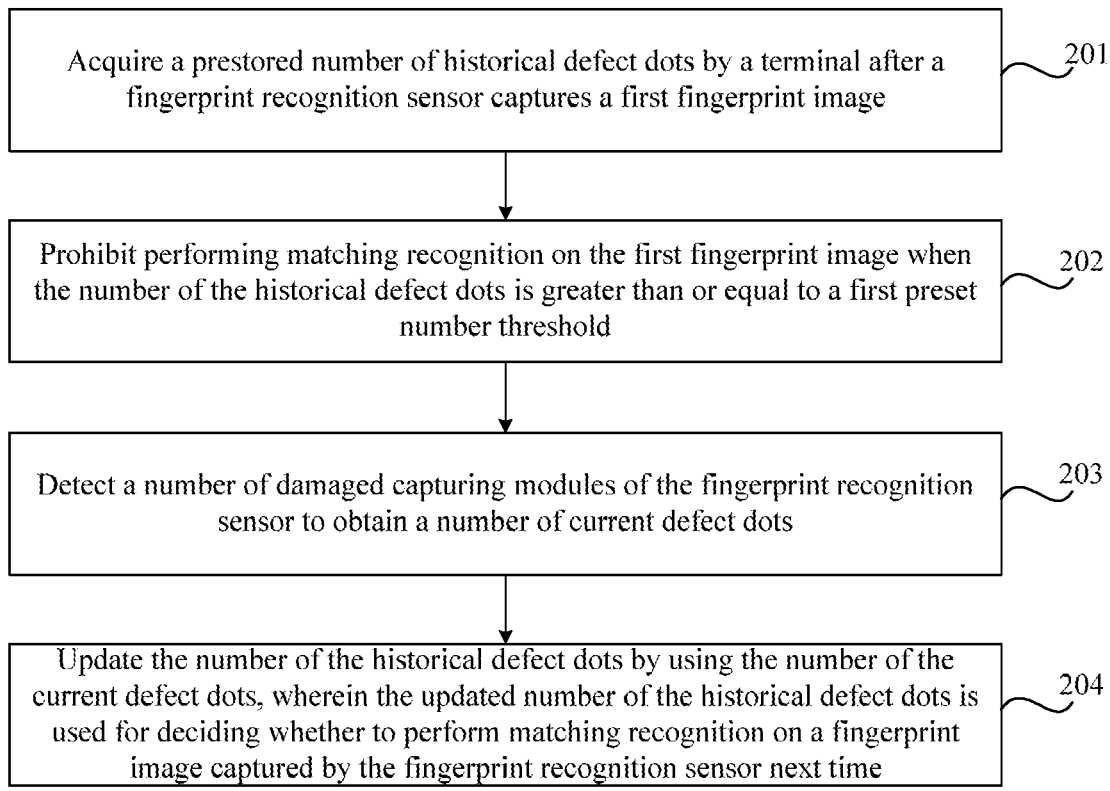
FIG. 2 is a flowchart of a fingerprint recognition method according to some embodiments.

Some embodiments of the present disclosure provide a fingerprint recognition method, which may be applied to a terminal provided with a fingerprint recognition sensor, with improved fingerprint recognition efficiency. As shown in FIG. 2, the fingerprint recognition sensor may include following steps.

In Step 201, the terminal acquires a prestored number of historical defect pixels after the fingerprint recognition sensor captures a first fingerprint image. The number of the historical defect pixels refers to a number of damaged capturing modules of the fingerprint recognition sensor detected by the terminal before the fingerprint recognition sensor captures the first fingerprint image.

In Step 202, the terminal prohibits performing matching recognition on the first fingerprint image when the number of the historical defect pixels is greater than or equal to a first preset number threshold.

In Step 203, the terminal detects the number of the damaged capturing modules of the fingerprint recognition sensor to obtain a number of current defect pixels.

In Step 204, the terminal updates the number of the historical defect pixels by using the number of the current defect pixels, wherein the updated number of the historical defect pixels is used for deciding whether to perform matching recognition on a fingerprint image captured by the fingerprint recognition sensor next time.

As such, according to the fingerprint recognition method provided by the embodiments of the present disclosure, performing matching recognition on the first fingerprint image is prohibited when it is determined that the number of the historical defect pixels is greater than or equal to a first preset number threshold. After performing matching recognition on the first fingerprint image is prohibited, the number of the damaged capturing modules of the fingerprint recognition sensor is detected again to obtain a number of current defect pixels.

Next, the number of the historical defect pixels is updated by using the number of the current defect pixels, wherein the updated number of the historical defect pixels is used for deciding whether to perform matching recognition on a fingerprint image captured next time. When the terminal misrecognizes a normal capturing module as a damaged capturing module, this may cause the number of the historical defect pixels to be greater than or equal to the first preset number threshold even though the fingerprint recognition sensor functions properly. In such a case, the terminal may revise the number of the historical defect pixels based on the number of the current defect pixels. In this way, it is ensured that in subsequent procedures, the terminal can normally recognize a fingerprint image, which can avoid or reduce occurrences of the situations that the fingerprint recognition sensor functions properly but the terminal cannot continuously recognize fingerprints, and thus the fingerprint recognition efficiency is enhanced.

Figure 3:
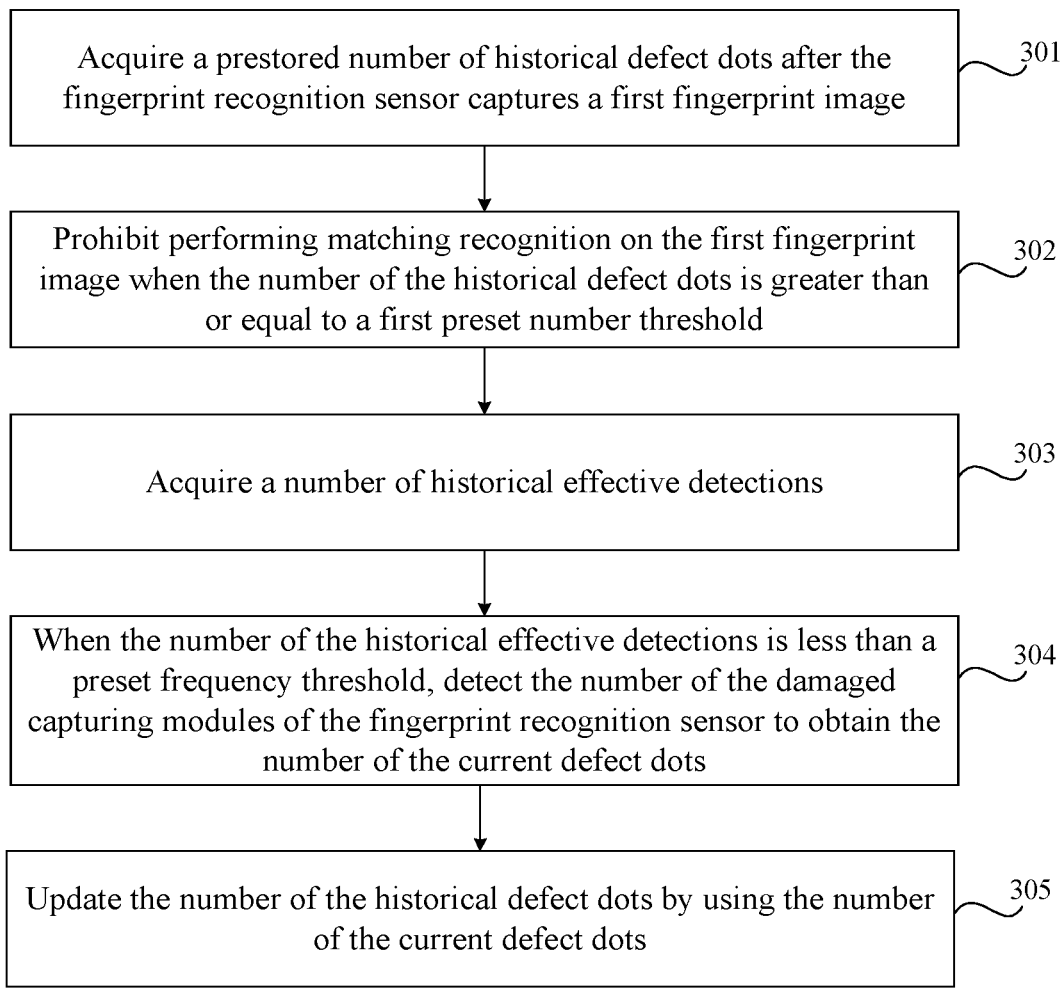
FIG. 3 is a flowchart of a fingerprint recognition method according to some embodiments.

According to some embodiments of the present disclosure, another fingerprint recognition method is provided, which can be applied to a terminal provided with a fingerprint recognition sensor. As shown in FIG. 3, the fingerprint recognition method may include following steps.

In Step 301, the terminal acquires a prestored number of historical defect pixels after the fingerprint recognition sensor captures a first fingerprint image.

As mentioned above, the terminal may periodically detect a number of damaged capturing modules of the fingerprint recognition sensor and regard it as a basis of deciding whether to prohibit the terminal from recognizing a fingerprint image. Therefore, in Step 301, after the fingerprint recognition sensor captures the first fingerprint image and before the terminal recognizes the first fingerprint image, the terminal may acquire a number of historical defect pixels and regard it as a basis of deciding whether to prohibit the terminal from recognizing the first fingerprint image. The number of the historical defect pixels refers to a number of damaged capturing modules of the fingerprint recognition sensor detected most recently by the terminal before the fingerprint recognition sensor captures the first fingerprint image.

In Step 302, the terminal prohibits performing matching recognition on the first fingerprint image when the number of the historical defect pixels is greater than or equal to a first preset number threshold.

When the number of the damaged capturing modules of the fingerprint recognition sensor is too large, the fingerprint recognition sensor cannot normally capture a fingerprint image. In this case, performing fingerprint recognition based on the fingerprint image captured by the fingerprint recognition sensor may likely cause a fingerprint recognition error. Therefore, in Step 302, when the number of the historical defect pixels is greater than or equal to the first preset number threshold, the terminal may prohibit performing matching recognition on the first fingerprint image to avoid the occurrence of fingerprint recognition error. However, the terminal may perform matching recognition on the first fingerprint image when the number of the historical defect pixels is less than the first preset number threshold.

It is to be noted that the first preset number threshold may be preset by a person of ordinary skill in the art, which is not specifically limited in the embodiments of the present disclosure.

In Step 303, the terminal acquires a number of historical effective detections.

In implementations, before the fingerprint recognition sensor captures the first fingerprint image, the terminal may have already detected the number of the damaged capturing modules of the fingerprint recognition sensor for many times. In Step 303, the terminal may determine an effective detection among the multiple detections. The effective detection refers to a detection where the number of the damaged capturing modules of the fingerprint recognition sensor detected by the terminal is greater than or equal to the first preset number threshold. The terminal may determine the number of the effective detections among the multiple detections as the number of the historical effective detections. It is to be noted that in the above steps, the terminal has determined that the number of the historical defect pixels is greater than or equal to the first preset number threshold. Therefore, a detection of obtaining the number of the historical defect pixels definitely is an effective detection. That is, the number of historical effective detections definitely is greater than or equal to 1.

In Step 304, when the number of the historical effective detections is less than a preset threshold, the terminal detects the number of the damaged capturing modules of the fingerprint recognition sensor to obtain the number of the current defect pixels.

When the number of the historical effective detections is rather small, e.g., smaller than the preset threshold value, this indicates that the number of the effective detections performed by the terminal is small before the fingerprint recognition sensor captures the first fingerprint image. In such a case, the relatively small number of the effective detections may likely be an accidental error caused by a fact that the terminal misrecognizes normal capturing modules as damaged capturing modules.

When the number of the historical effective detections is relatively large, e.g., greater than or equal to the preset frequency (e.g., number of occurrences) threshold, this indicates that the number of the effective detections performed by the terminal is relatively large before the fingerprint recognition sensor captures the first fingerprint image.

In such a case, a possibility that accidental errors occur in the greater number of the effective detections is greatly reduced. That is, in this case, the possibility that the number of the damaged capturing modules of the fingerprint recognition sensor indeed is greater than or equal to the first preset number threshold is higher.

In implementations, the preset frequency threshold may be preset by a person of ordinary skill in the art. For example, in one embodiment of the present disclosure, the preset frequency threshold may be 1.

Therefore, to avoid or reduce occurrences of accidental errors causing the terminal to mis-determine that the number of the damaged capturing modules of the fingerprint recognition sensor is greater than or equal to the first preset number threshold, after prohibiting performing matching recognition on the first fingerprint image, the terminal may detect again the number of the damaged capturing modules of the fingerprint recognition sensor when the number of the historical effective detections is less than the preset frequency threshold to obtain the number of the current defect pixels. By detecting again with the terminal, the number of the damaged capturing modules of the fingerprint recognition sensor, the probability of an accidental error is reduced, which may cause the terminal to mis-determine that the number of the damaged capturing modules of the fingerprint recognition sensor is greater than or equal to the first preset number threshold.

To reduce the number of procedures and save electricity for the terminal, after prohibiting performing matching recognition on the first fingerprint image, the terminal may not perform the procedure of detecting the number of the damaged capturing modules of the fingerprint recognition sensor when the number of the historical effective detections is greater than or equal to the preset frequency threshold to obtain the number of the current defect pixels.

In the following, reference is made to the procedures of detecting the number of the damaged capturing modules of the fingerprint recognition sensor in some embodiments of the present disclosure.

In some implementations, the terminal may apply a preset voltage to each of the capturing modules of the fingerprint recognition sensor after detecting a finger leaving the sensor.

Next, the terminal may acquire an electric current value for each of the capturing modules after the preset voltage is applied, and decide whether the electric current value of each of the capturing module satisfies a preset condition after the preset voltage is applied, wherein the preset condition may be a condition that the electric current value is smaller than a first preset electric current value threshold, or the preset condition may be a condition that the electric current value is greater than a second preset electric current value threshold. When the electric current value of a certain capturing module of the fingerprint recognition sensor satisfies the preset condition, the terminal may determine this capturing module as a damaged capturing module. Next, the terminal may acquire the number of the damaged capturing modules of the fingerprint recognition sensor, and regard it as the number of the current defect pixels.

In some embodiments of the present disclosure, the number of the current defect pixels may include a number of current first defect pixels, a number of current second defect pixels, or a number of current third defect pixels.

In some implementations, when the terminal detects in Step 304 that the number of the damaged capturing modules of the fingerprint recognition sensor is less than the first preset number threshold, this indicates that an effective detection for obtaining the number of the historical defect pixels likely may be an accidental error caused by the terminal mis-determining a normal capturing module as a damaged capturing module.

At this time, the terminal may acquire and regard the number of the damaged capturing modules of the fingerprint recognition sensor detected in Step 304 as the number of the current first defect pixels.

In subsequent steps, the terminal may update the number of the historical defect pixels by using the number of the current first defect pixels, and regard the updated number of the historical defect pixels as a basis of deciding whether to perform matching recognition on a fingerprint image captured by the fingerprint recognition sensor next time.

As such, after updating the number of the historical defect pixels by using the number of the current first defect pixels, the terminal can recognize the fingerprint image captured by the fingerprint recognition sensor next time, thereby preventing or reducing the occurrences of situations that the fingerprint recognition sensor functions properly but the terminal cannot continuously recognize a fingerprint, and thus the fingerprint recognition efficiency is enhanced.

When the terminal detects in Step 304 that the number of the damaged capturing modules of the fingerprint recognition sensor is greater than or equal to the first preset number threshold, this indicates that an effective detection for obtaining the number of the historical defect pixels likely is not the accidental error caused by the terminal mis-determining a normal capturing module as a damaged capturing module. That is, the probability that the number of the damaged capturing modules of the fingerprint recognition sensor indeed is greater than or equal to the first preset number threshold is higher.

In the above case, in some implementations, the terminal may acquire and regard the number of the damaged capturing modules of the fingerprint recognition sensor detected in Step 304 as the number of the current third defect pixels. In subsequent steps, the terminal may update the number of the historical defect pixels by using the number of the current third defect pixels, and regard the updated number of the historical defect pixels as a basis of deciding whether to perform matching recognition on a fingerprint image captured by the fingerprint recognition sensor next time. In some embodiments, the terminal may not update the number of the historical defect pixels by using the number of the current third defect pixels in the subsequent steps. As such, after the fingerprint recognition sensor captures a fingerprint image next time, the terminal still can prohibit performing matching recognition on the fingerprint image, and thus the fingerprint recognition security is ensured.

In some other implementations, when the terminal detects that the number of the damaged capturing modules of the fingerprint recognition sensor detected in Step 304 is greater than or equal to the first preset number threshold, the terminal may detect a number of the damaged capturing modules within a preset region of the fingerprint recognition sensor and obtain the number of the damaged capturing modules within the preset region as the number of the current second defect pixels. The preset region is a region where the capturing module having a probability of successfully capturing the fingerprint image greater than a preset probability threshold is.

Generally, capturing modules within different regions of the fingerprint recognition sensor have different probabilities in capturing fingerprint images. For example, capturing modules within edge regions of the fingerprint recognition sensor have lower probabilities in capturing fingerprint images, whereas capturing modules within a central region of the fingerprint recognition sensor have higher probabilities in capturing fingerprint images.

Damage of the capturing modules having lower probabilities in capturing fingerprint images has less negative effect on normally capturing fingerprint images by the fingerprint recognition sensor. That is, as long as the number of the damaged capturing modules having higher probabilities in capturing fingerprint images is relatively small, the fingerprint recognition sensor still likely can capture the fingerprint images normally.

Therefore, when the terminal determines whether the number of the damaged capturing modules of the fingerprint recognition sensor detected in Step 304 is greater than or equal to the first preset number threshold, the terminal may detect a number of the damaged capturing modules within a preset region of the fingerprint recognition sensor and obtain the number of the damaged capturing modules within the preset region as the number of the current second defect pixels.

In subsequent steps, the terminal may update the number of the historical defect pixels by using the number of the current second defect pixels, and use the updated number of the historical defect pixels as a basis of deciding whether to perform matching recognition on a fingerprint image captured by the fingerprint recognition sensor next time. In this way, it may be ensured that the fingerprint recognition sensor still likely can capture the fingerprint images normally even though the number of the damaged capturing modules of the fingerprint recognition sensor is greater than or equal to the first preset number threshold.

It is to be noted that in the process of detecting, by the terminal, the number of the damaged capturing modules of the fingerprint recognition sensor to obtain the number of the current defect pixels, the terminal also may detect and store locations of the damaged capturing modules of the fingerprint recognition sensor to use as auxiliary reference information in subsequent maintenance process.

In Step 305, the terminal updates the number of the historical defect pixels by using the number of the current defect pixels.

As mentioned above, the terminal may update the number of the historical defect pixels by using the number of the current first defect pixels, the number of the current second defect pixels or the number of the current third defect pixels, wherein the updated number of the historical defect pixels is used for deciding whether to perform matching recognition on a fingerprint image captured next time.

In some implementations, when the number of the current defect pixels acquired by the terminal is the number of the current first defect pixels, i.e., when the number of the current defect pixels is less than the first preset number threshold, this indicates that the number of the damaged capturing modules of the fingerprint recognition sensor is less than the first preset number threshold. In such a case, the terminal may prompt a user to reperform fingerprint recognition.

When the number of the current defect pixels acquired by the terminal is the number of the current third defect pixels, i.e., when the number of the current defect pixels is greater than or equal to the first preset number threshold, this indicates that the number of the damaged capturing modules of the fingerprint recognition sensor is indeed greater than or equal to the first preset number threshold. That is, the fingerprint recognition sensor cannot normally capture a fingerprint image. In such a case, the terminal may prompt a user to replace the fingerprint recognition sensor.

When the number of the current defect pixels acquired by the terminal is the number of the current second defect pixels, and after the terminal updates the number of the historical defect pixels using the number of the current second defect pixels, the terminal may decide whether the updated number of the historical defect pixels (i.e., the number of the current second defect pixels) is less than the second preset number threshold when the fingerprint recognition sensor captures a fingerprint image next time, i.e., when the fingerprint recognition sensor captures the second fingerprint image. When the updated number of the historical defect pixels is less than the second preset number threshold, this indicates that the number of the damaged capturing modules of the fingerprint recognition sensor having higher probabilities in capturing fingerprint images is less, at this moment the fingerprint recognition sensor still likely can capture the fingerprint images normally. In such a case, the terminal may acquire, from the second fingerprint image, a fingerprint image region captured by capturing modules within the preset region, and perform matching recognition on the fingerprint image region. When the updated number of the historical defect pixels is greater than or equal to the second preset number threshold, this indicates that the number of the damaged capturing modules of the fingerprint recognition sensor having higher probabilities in capturing fingerprint images is larger, at this moment the fingerprint recognition sensor cannot capture fingerprint images. In such a case, the terminal may prohibit performing matching recognition on the second fingerprint image.

It is to be noted that the second preset number threshold may be preset by a person of ordinary skill in the art, which is not specifically limited in the embodiments of the present disclosure.

Therefore, according to the fingerprint recognition method provided by some embodiments of the present disclosure, performing matching recognition on the first fingerprint image is prohibited when it is determined that the number of the historical defect pixels is greater than or equal to a first preset number threshold. After performing matching recognition on the first fingerprint image is prohibited, the number of the damaged capturing modules of the fingerprint recognition sensor is detected again to obtain a number of current defect pixels.

Next, the number of the historical defect pixels is updated by using the number of the current defect pixels, wherein the updated number of the historical defect pixels is used for deciding whether to perform matching recognition on a fingerprint image captured next time.

When the terminal misrecognizes a normal capturing module as a damaged capturing module, this may cause the number of the historical defect pixels to be greater than or equal to the first preset number threshold even though the fingerprint recognition sensor functions properly. In such a case, the terminal may revise the number of the historical defect pixels based on the number of the current defect pixels. In this way, it is ensured that in subsequent procedures, the terminal can normally recognize a fingerprint image, which avoids or reduces occurrences of the situations that the fingerprint recognition sensor functions properly but the terminal cannot continuously recognize fingerprints. As a result, the fingerprint recognition efficiency is improved.

Figure 4:
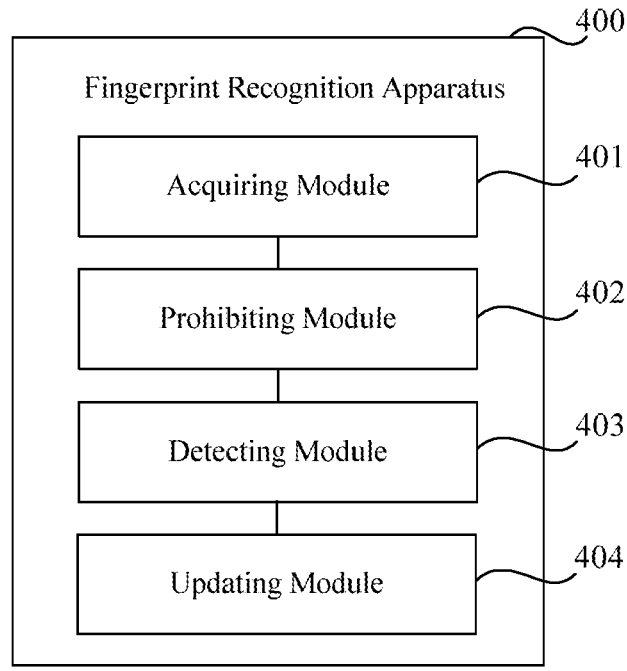
FIG. 4 is a block diagram of a fingerprint recognition apparatus according to some embodiments.

Some embodiments of the present disclosure also provide a fingerprint recognition apparatus 400, as illustrated in FIG. 4. The fingerprint recognition apparatus 400 may include an acquiring module 401, a prohibiting module 402, a detecting module 403, and an updating module 404.

The acquiring module 401 is configured to acquire a prestored number of historical defect pixels after a fingerprint recognition sensor captures a first fingerprint image. The number of the historical defect pixels refers to a number of damaged capturing modules of the fingerprint recognition sensor detected before the fingerprint recognition sensor captures the first fingerprint image.

The prohibiting module 402 is configured to prohibit performing matching recognition on the first fingerprint image when the number of the historical defect pixels is greater than or equal to a first preset number threshold.

The detecting module 403 is configured to detect the number of the damaged capturing modules of the fingerprint recognition sensor to obtain a number of current defect pixels.

The updating module 404 is configured to update the number of the historical defect pixels by using the number of the current defect pixels. The updated number of the historical defect pixels is used for deciding whether to perform matching recognition on a fingerprint image captured next time.

In some embodiment of the present disclosure, the detecting module 403 is configured to: acquire a number of historical effective detections, the number of the historical effective detections referring to a number of times of the detected number of the damaged capturing modules of the fingerprint recognition sensor being greater than or equal to the first preset number threshold before the fingerprint recognition sensor captures the first fingerprint image; and detect the number of the damaged capturing modules of the fingerprint recognition sensor when the number of the historical effective detections is less than a preset frequency threshold to obtain the number of the current defect pixels.

In some embodiments of the present disclosure, the number of the current defect pixels includes a number of current first defect pixels or a number of current second defect pixels. The detecting module 403 is configured to: detect the number of the damaged capturing modules of the fingerprint recognition sensor; obtain the number of the damaged capturing modules of the fingerprint recognition sensor as the number of the current first defect pixels when the number of the damaged capturing modules of the fingerprint recognition sensor is less than the first preset number threshold; and detect a number of damaged capturing modules within a preset region of the fingerprint recognition sensor and obtain the number of the damaged capturing modules within the preset region as the number of the current second defect pixels when the number of the damaged capturing modules of the fingerprint recognition sensor is greater than or equal to the first preset number threshold.

In some embodiments, the preset region is a region where the capturing module has a probability of successfully capturing the fingerprint image greater than a preset probability threshold.

In some embodiments of the present disclosure, the updating module 404 is configured to update the number of the historical defect pixels by using the number of the current first defect pixels or the number of the current second defect pixels.

In some embodiments of the present disclosure, the detecting module 403 is further configured to detect and store locations of the damaged capturing modules of the fingerprint recognition sensor after prohibiting performing matching recognition on the first fingerprint image.

In some embodiments of the present disclosure, the detecting module 403 is configured to: apply a preset voltage to each of the capturing modules of the fingerprint recognition sensor after detecting a finger leaves; acquire an electric current value for each of the capturing modules after the preset voltage is applied; determine one of the capturing modules of the fingerprint recognition sensor as a damaged capturing module when the electric current value of the capturing module satisfies a preset condition after the preset voltage is applied; and acquire the number of the damaged capturing modules of the fingerprint recognition sensor to obtain the number of the current defect pixels.

Figure 5:
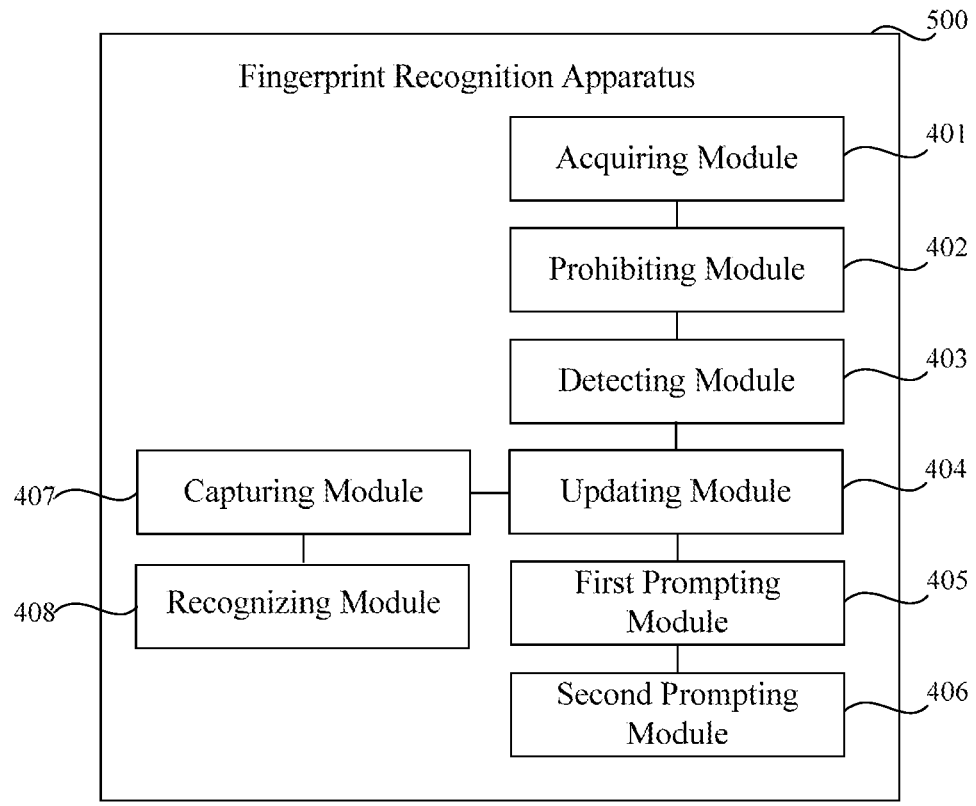
FIG. 5 is a block diagram of a fingerprint recognition apparatus according to some embodiments.

As shown in FIG. 5, some embodiments of the present disclosure also provide a fingerprint recognition apparatus 500. In addition to including modules included in the fingerprint recognition apparatus 400, the fingerprint recognition apparatus 500 further includes a first prompting module 405, a second prompting module 406, a capturing module 407, and a recognizing module 408.

The first prompting module 405 is configured to prompt a user to reperform fingerprint recognition when the number of the current defect pixels is less than the first preset number threshold.

The second prompting module 406 is configured to prompt a user to replace the fingerprint recognition sensor when the number of the current defect pixels is greater than or equal to the first preset number threshold.

The capturing module 407 is configured to acquire, from a second fingerprint image, a fingerprint image region captured by the capturing module within the preset region when the fingerprint recognition sensor successfully captures the second fingerprint image and the updated number of the historical defect pixels is less than a second preset number threshold after updating the number of the historical defect pixels by using the number of the current second defect pixels.

The recognizing module 408 is configured to perform matching recognition on the fingerprint image region.

Therefore, according to some embodiments of the fingerprint recognition apparatus, performing matching recognition on the first fingerprint image is prohibited when it is determined that the number of the historical defect pixels is greater than or equal to a first preset number threshold. After performing matching recognition on the first fingerprint image is prohibited, the number of the damaged capturing modules of the fingerprint recognition sensor is detected again to obtain a number of current defect pixels. Next, the number of the historical defect pixels is updated by using the number of the current defect pixels, wherein the updated number of the historical defect pixels is used for deciding whether to perform matching recognition on a fingerprint image captured next time. When the terminal misrecognizes a normal capturing module as a damaged capturing module, this may cause the number of the historical defect pixels to be greater than or equal to the first preset number threshold even though the fingerprint recognition sensor functions properly. In such a case, the terminal may revise the number of the historical defect pixels based on the number of the current defect pixels. In this way, it is ensured that in subsequent procedures, the terminal can normally recognize a fingerprint image, which avoids occurrence of the circumstance that the fingerprint recognition sensor functions properly but the terminal cannot continuously recognize fingerprints, and thus the fingerprint recognition efficiency is enhanced.

With regard to the apparatus in the above embodiments, specific implementations for executing operations by modules thereof have been described in detail in the embodiments related to the method, and thus are not elaborated herein.

Figure 6:
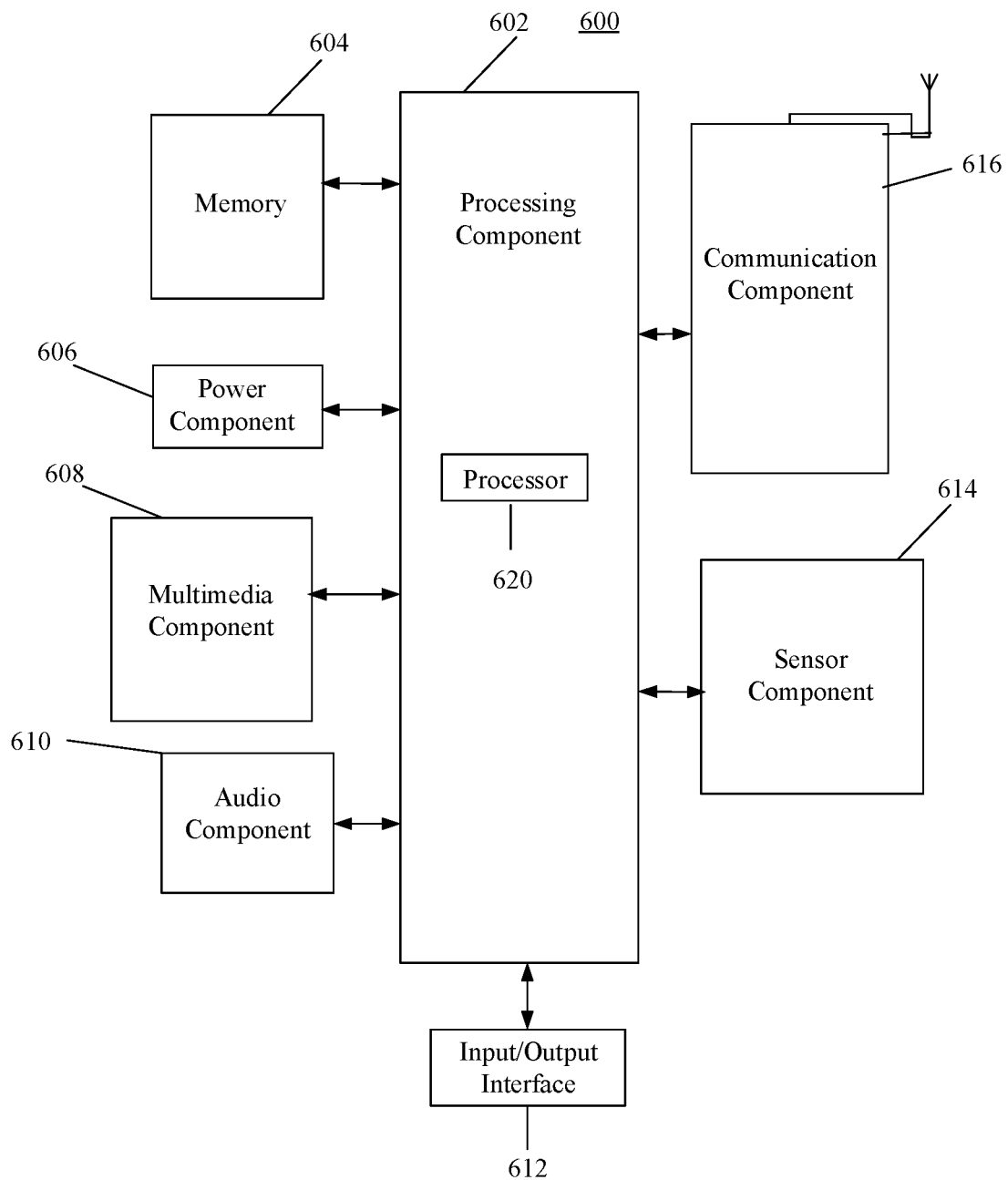
FIG. 6 is a block diagram of a fingerprint recognition apparatus according to some embodiments.

FIG. 6 is a block diagram of a fingerprint recognition apparatus 600 according to some embodiments. For example, the apparatus 600 may be a mobile phone, a computer, a digital broadcast terminal, a message transceiver device, a game console, a tablet device, a medical equipment, a fitness equipment, a personal digital assistant, and the like.

Referring to FIG. 6, the apparatus 600 may include one or more of the following components: a processing component or circuit 602, memory 604, a power component 606, a multimedia component 608, an audio component 610, an input/output (I/O) interface 612, a sensor component 614, and a communication component 616.

The processing component 602 typically controls overall operations of the apparatus 600, such as the operations associated with display, telephone calls, data communications, camera operations, and recording operations. The processing component 602 may include one or more processors 620 to execute instructions to perform all or part of the steps in the above described methods. Moreover, the processing component 602 may include one or more modules which facilitate the interaction between the processing component 602 and other components. For instance, the processing component 602 may include a multimedia module to facilitate the interaction between the multimedia component 608 and the processing component 602.

The memory 604 is configured to store various types of data to support the operation of the apparatus 600. Examples of such data include instructions for any applications or methods operated on the apparatus 600, contact data, phonebook data, messages, pictures, video, etc. The memory 604 may be implemented using any type of volatile or non-volatile memory devices, or a combination thereof, such as a static random-access memory (SRAM), an electrically erasable programmable read-only memory (EEPROM), an erasable programmable read-only memory (EPROM), a programmable read-only memory (PROM), a read-only memory (ROM), a magnetic memory, a flash memory, a magnetic or optical disk.

The power component 606 provides power to various components of the apparatus 600. The power component 606 may include a power management system, one or more power sources, and any other components associated with the generation, management, and distribution of power in the apparatus 600.

The multimedia component 608 includes a screen providing an output interface between the apparatus 600 and the user. In some embodiments, the screen may include a liquid crystal display (LCD) and a touch panel (TP).

In some implementations, the display device is not limited to the LCD display, but can include, for example, a VR/AR device, a head-mount display (HMD) device, a head-up display (HUD) device, smart eyewear (e.g., glasses), LED (light-emitting diode), OLED (organic light-emitting diode), TFT (thin-film transistor), plasma, other flexible configuration, or any other monitor for displaying information to the user and a keyboard, a pointing device, e.g., a mouse, trackball, etc., or a touch screen, touch pad, etc., by which the user can provide input to the computer.

If the screen includes a touch panel, the screen may be implemented as a touch screen to receive input signals from the user. The touch panel includes one or more touch sensors to sense touches, slips, and gestures on the touch panel. The touch sensors may not only sense a boundary of a touch or slip action, but also sense a period of time and a pressure associated with the touch or slip action. In some embodiments, the multimedia component 608 may include a front camera and/or a rear camera. The front camera and/or the rear camera may receive an external multimedia datum while the apparatus 600 is in an operation mode, such as a photographing mode or a video mode. Each of the front camera and the rear camera may be a fixed optical lens system or have focus and optical zoom capability.

The audio component 610 is configured to output and/or input audio signals. For example, the audio component 610 includes a microphone ("MIC") configured to receive an external audio signal when the apparatus 600 is in an operation mode, such as a call mode, a recording mode, and a voice recognition mode. The received audio signal may be further stored in the memory 604 or transmitted via the communication component 616. In some embodiments, the audio component 610 further includes a speaker to output audio signals.

The I/O interface 612 provides an interface between the processing component 602 and peripheral interface modules, such as a keyboard, a click wheel, buttons, and the like. The buttons may include, but are not limited to, a home button, a volume button, a starting button, and a locking button.

The sensor component 614 includes one or more sensors to provide status assessments of various aspects of the apparatus 600. For instance, the sensor component 614 may detect an open/closed status of the apparatus 600, relative positioning of components, e.g., the display and the keypad, of the apparatus 600, a change in position of the apparatus 600 or a component of the apparatus 600, a presence or absence of user contact with the apparatus 600, an orientation or an acceleration/deceleration of the apparatus 600, and a change in temperature of the apparatus 600.

The sensor component 614 may include a proximity sensor configured to detect the presence of nearby objects without any physical contact. The sensor component 614 may also include a light sensor, such as a complementary metal-oxide-semiconductor (CMOS) or charged-coupled device (CCD) image sensor, for use in imaging applications. In some embodiments, the sensor component 614 may also include an acceleration sensor, a gyroscope sensor, a magnetic sensor, a pressure sensor, or a temperature sensor. The sensor component 614 may also include a fingerprint recognition sensor.

The communication component 616 is configured to facilitate communication, wired or wirelessly, between the apparatus 600 and other devices. The apparatus 600 can access a wireless network based on a communication standard, such as WiFi, 2G or 3G or a combination thereof. In one exemplary embodiment, the communication component 616 receives a broadcast signal or broadcast associated information from an external broadcast management system via a broadcast channel. In one exemplary embodiment, the communication component 616 further includes a near field communication (NFC) module to facilitate short-range communications. For example, the NFC module may be implemented based on a radio frequency identification (RFID) technology, an infrared data association (IrDA) technology, an ultra-wideband (UWB) technology, a Bluetooth (BT) technology, and other technologies.

In exemplary embodiments, the apparatus 600 may be implemented with one or more application specific integrated circuits (ASICs), digital signal processors (DSPs), digital signal processing devices (DSPDs), programmable logic devices (PLDs), field programmable gate arrays (FPGAs), controllers, micro-controllers, microprocessors, or other electronic components, for performing the above described methods.

In some embodiments, there is also provided a non-transitory computer-readable storage medium including instructions, such as included in the memory 604, executable by the processor 620 in the apparatus 600, for performing the above-described methods. For example, the non-transitory computer-readable storage medium may be a ROM, a RAM, a CD-ROM, a magnetic tape, a floppy disc, an optical data storage device, and the like.

In some embodiments, there is also provided a computer-readable storage medium. As a non-transitory computer-readable storage medium, the computer-readable storage medium stores a computer program. When the computer program stored in the computer-readable storage medium is executed by a processing component of a terminal, the terminal is caused to perform a fingerprint recognition method. For example, the fingerprint recognition method may include: acquiring a prestored number of historical defect pixels after a fingerprint recognition sensor captures a first fingerprint image, the number of the historical defect pixels referring to a number of damaged capturing modules of the fingerprint recognition sensor detected before the fingerprint recognition sensor captures the first fingerprint image; prohibiting performing matching recognition on the first fingerprint image when the number of the historical defect pixels is greater than or equal to a first preset number threshold; detecting a number of damaged capturing modules of the fingerprint recognition sensor to obtain a number of current defect pixels; and updating the number of the historical defect pixels by using the number of the current defect pixels. The updated number of the historical defect pixels is used for deciding whether to perform matching recognition on a fingerprint image captured next time.

It is intended that the specification and embodiments be considered as examples only. Other embodiments of the disclosure will be apparent to those skilled in the art in view of the specification and drawings of the present disclosure. That is, although specific embodiments have been described above in detail, the description is merely for purposes of illustration. It should be appreciated, therefore, that many aspects described above are not intended as required or essential elements unless explicitly stated otherwise.

Various modifications of, and equivalent acts corresponding to, the disclosed aspects of the example embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A fingerprint recognition method, comprising:
   acquiring a prestored number of historical defect pixels after a fingerprint recognition sensor captures a first fingerprint image, the number of the historical defect pixels referring to a number of damaged capturing modules of the fingerprint recognition sensor detected before the fingerprint recognition sensor captures the first fingerprint image;
   prohibiting performing matching recognition on the first fingerprint image upon the number of the historical defect pixels being greater than or equal to a first preset number threshold;
   detecting the number of the damaged capturing modules of the fingerprint recognition sensor to obtain a number of current defect pixels; and
   updating the number of the historical defect pixels by using the number of the current defect pixels, the updated number of the historical defect pixels being used for determining whether to perform matching recognition on a fingerprint image captured next time,
   wherein the detecting the number of the damaged capturing modules of the fingerprint recognition sensor to obtain a number of current defect pixels comprises:
      acquiring a number of historical effective detections, the number of the historical effective detections referring to a number of times of the detected number of the damaged capturing modules of the fingerprint recognition sensor being greater than or equal to the first preset number threshold before the fingerprint recognition sensor captures the first fingerprint image; and
      detecting the number of the damaged capturing modules of the fingerprint recognition sensor when the number of the historical effective detections is less than a preset frequency threshold to obtain the number of the current defect pixels.

2. The method according to claim 1, further comprising:
   prompting a user to reperform fingerprint recognition when the number of the current defect pixels is less than the first preset number threshold.

3. The method according to claim 1, further comprising:
   prompting a user to replace the fingerprint recognition sensor when the number of the current defect pixels is greater than or equal to the first preset number threshold.

4. The method according to claim 1, wherein the number of the current defect pixels comprises a number of current first defect pixels or a number of current second defect pixels, and the detecting the number of the damaged capturing modules of the fingerprint recognition sensor to obtain the number of current defect pixels comprises:
   detecting the number of the damaged capturing modules of the fingerprint recognition sensor;
   obtaining the number of the damaged capturing modules of the fingerprint recognition sensor as the number of the current first defect pixels when the number of the damaged capturing modules of the fingerprint recognition sensor is less than the first preset number threshold; and
   detecting a number of damaged capturing modules within a preset region of the fingerprint recognition sensor and obtaining the number of the damaged capturing modules within the preset region as the number of the current second defect pixels when the number of the damaged capturing modules of the fingerprint recognition sensor is greater than or equal to the first preset number threshold.

5. The method according to claim 4, wherein the updating the number of the historical defect pixels by using the number of the current defect pixels comprises:
   updating the number of the historical defect pixels by using the number of the current first defect pixels or the number of the current second defect pixels.

6. The method according to claim 5, further comprising:
   acquiring, from a second fingerprint image, a fingerprint image region captured by the capturing module within the preset region when the fingerprint recognition sensor successfully captures the second fingerprint image and the updated number of the historical defect pixels is less than a second preset number threshold after updating the number of the historical defect pixels by using the number of the current second defect pixels; and
   performing matching recognition on the fingerprint image region.

7. The method according to claim 4, wherein the preset region is a region where the capturing module has a probability of successfully capturing the fingerprint image greater than a preset probability threshold.

8. The method according to claim 1, further comprising:
   detecting and storing locations of the damaged capturing modules of the fingerprint recognition sensor after prohibiting performing matching recognition on the first fingerprint image.

9. The method according to claim 1, wherein the detecting the number of the damaged capturing modules of the fingerprint recognition sensor to obtain a number of current defect pixels comprises:
   applying a preset voltage to each of the capturing modules of the fingerprint recognition sensor after detecting a finger leaves the fingerprint recognition sensor;
   acquiring an electric current value for each of the capturing modules after the preset voltage is applied;
   determining one of the capturing modules of the fingerprint recognition sensor as a damaged capturing module when the electric current value of the capturing module satisfies a preset condition after the preset voltage is applied; and
   acquiring the number of the damaged capturing modules of the fingerprint recognition sensor to obtain the number of the current defect pixels.

10. A fingerprint recognition apparatus, comprising:
    a processor, and
    memory having instructions stored thereon for execution by the processor;
    wherein instructions comprise:
       acquiring a prestored number of historical defect pixels after a fingerprint recognition sensor captures a first fingerprint image, the number of the historical defect pixels referring to a number of damaged capturing modules of the fingerprint recognition sensor detected before the fingerprint recognition sensor captures the first fingerprint image;
       prohibiting performing matching recognition on the first fingerprint image when the number of the historical defect pixels is greater than or equal to a first preset number threshold;
       detecting the number of the damaged capturing modules of the fingerprint recognition sensor to obtain a number of current defect pixels; and updating the number of the historical defect pixels by using the number of the current defect pixels, the updated number of the historical defect pixels being used for deciding whether to perform matching recognition on a fingerprint image captured next time, wherein the detecting the number of the damaged capturing modules of the fingerprint recognition sensor to obtain a number of current defect pixels comprises:

acquiring a number of historical effective detections, the number of the historical effective detections referring to a number of times of the detected number of the damaged capturing modules of the fingerprint recognition sensor being greater than or equal to the first preset number threshold before the fingerprint recognition sensor captures the first fingerprint image; and detecting the number of the damaged capturing modules of the fingerprint recognition sensor when the number of the historical effective detections is less than a preset frequency threshold to obtain the number of the current defect pixels.

11. The apparatus according to claim 10, wherein the instructions further comprise:

prompting a user to reperform fingerprint recognition when the number of the current defect pixels is less than the first preset number threshold.

12. The apparatus according to claim 10, wherein the instructions further comprise:

prompting a user to replace the fingerprint recognition sensor when the number of the current defect pixels is greater than or equal to the first preset number threshold.

13. The apparatus according to claim 10, wherein the number of the current defect pixels comprises a number of current first defect pixels or a number of current second defect pixels, and the detecting the number of the damaged capturing modules of the fingerprint recognition sensor to obtain the number of current defect pixels comprises:

detecting the number of the damaged capturing modules of the fingerprint recognition sensor;

obtaining the number of the damaged capturing modules of the fingerprint recognition sensor as the number of the current first defect pixels when the number of the damaged capturing modules of the fingerprint recognition sensor is less than the first preset number threshold; and detecting a number of damaged capturing modules within a preset region of the fingerprint recognition sensor and obtaining the number of the damaged capturing modules within the preset region as the number of the current second defect pixels when the number of the damaged capturing modules of the fingerprint recognition sensor is greater than or equal to the first preset number threshold.

14. The apparatus according to claim 13, wherein the updating the number of the historical defect pixels by using the number of the current defect pixels comprises:

updating the number of the historical defect pixels by using the number of the current first defect pixels or the number of the current second defect pixels.

15. The apparatus according to claim 14, further comprising:

acquiring, from a second fingerprint image, a fingerprint image region captured by the capturing module within the preset region when the fingerprint recognition sensor successfully captures the second fingerprint image and the updated number of the historical defect pixels is less than a second preset number threshold after updating the number of the historical defect pixels by using the number of the current second defect pixels; and performing matching recognition on the fingerprint image region.

16. The apparatus according to claim 13, wherein the preset region is a region where the capturing module having a probability of successfully capturing the fingerprint image greater than a preset probability threshold is.

17. The apparatus according to claim 10, wherein the detecting the number of the damaged capturing modules of the fingerprint recognition sensor to obtain a number of current defect pixels comprises:

applying a preset voltage to each of the capturing modules of the fingerprint recognition sensor after detecting a finger leaves;

acquiring an electric current value for each of the capturing modules after the preset voltage is applied;

determining one of the capturing modules of the fingerprint recognition sensor as a damaged capturing module when the electric current value of the capturing module satisfies a preset condition after the preset voltage is applied; and acquiring the number of the damaged capturing modules of the fingerprint recognition sensor to obtain the number of the current defect pixels.

18. A non-transitory computer-readable storage medium having a computer program stored thereon, for execution by a processing circuit to implement a fingerprint recognition method, wherein the fingerprint recognition method comprises:

acquiring a prestored number of historical defect pixels after a fingerprint recognition sensor captures a first fingerprint image, the number of the historical defect pixels referring to a number of damaged capturing modules of the fingerprint recognition sensor detected before the fingerprint recognition sensor captures the first fingerprint image;

prohibiting performing matching recognition on the first fingerprint image when the number of the historical defect pixels is greater than or equal to a first preset number threshold;

detecting the number of the damaged capturing modules of the fingerprint recognition sensor to obtain a number of current defect pixels; and updating the number of the historical defect pixels by using the number of the current defect pixels, the updated number of the historical defect pixels being used for deciding whether to perform matching recognition on a fingerprint image captured next time;

wherein the detecting the number of the damaged capturing modules of the fingerprint recognition sensor to obtain a number of current defect pixels comprises:

acquiring a number of historical effective detections, the number of the historical effective detections referring to a number of times of the detected number of the damaged capturing modules of the fingerprint recognition sensor being greater than or equal to the first preset number threshold before the fingerprint recognition sensor captures the first fingerprint image; and detecting the number of the damaged capturing modules of the fingerprint recognition sensor when the number of the historical effective detections is less than a preset frequency threshold to obtain the number of the current defect pixels.

* * * * *